United States Patent
Brown et al.

(10) Patent No.: US 8,546,723 B2
(45) Date of Patent: Oct. 1, 2013

(54) FORMING HOLES USING LASER ENERGY (75) Inventors: Thomas M. Brown, Rome (IT); Carl Hayton, Cambridge (GB)

(73) Assignee: Plastic Logic Limited, Cambridge (GB)

(*) Notice: Subject to any disclaimer, the term of this patent is extended or adjusted under 35 U.S.C. 154(b) by 1769 days.

(21) Appl. No.: 11/521,533

(22) Filed: Sep. 15, 2006

(65) Prior Publication Data

US 2007/0092637 A1    Apr. 26, 2007

(30) Foreign Application Priority Data

Sep. 15, 2005  (GB) .................................. 0518843.8

(51) Int. Cl.
  *B23K 26/00* (2006.01)
  *B23K 26/04* (2006.01)
(52) U.S. Cl.
  USPC .................................. 219/121.71; 219/121.62
(58) Field of Classification Search
  USPC ............... 219/121.71, 121.7, 121.61, 121.62, 219/121.85
  See application file for complete search history.

(56) References Cited

U.S. PATENT DOCUMENTS

| | | | |
|---|---|---|---|
| 4,894,115 A | | 1/1990 | Eichelberger et al. |
| 5,073,814 A | * | 12/1991 | Cole et al. ..................... 257/643 |
| 5,841,099 A | * | 11/1998 | Owen et al. ............. 219/121.69 |
| 6,023,041 A | * | 2/2000 | Noddin ..................... 219/121.71 |
| 6,407,363 B2 | * | 6/2002 | Dunsky et al. ........... 219/121.71 |
| 7,382,389 B2 | * | 6/2008 | Cordingley et al. .......... 347/224 |
| 2002/0063361 A1 | * | 5/2002 | Fahey .......................... 264/400 |
| 2003/0152756 A1 | | 8/2003 | Yamada et al. |
| 2006/0169677 A1 | * | 8/2006 | Deshi ........................ 219/121.7 |

FOREIGN PATENT DOCUMENTS

| | | |
|---|---|---|
| EP | 0 436 320 A2 | 7/1991 |
| EP | 0465197 A2 | 1/1992 |
| JP | 2-297932 A | 12/1990 |
| JP | 07308791 A | 11/1995 |
| JP | 10-137953 A | 5/1998 |
| WO | WO 98/20531 A2 | 5/1998 |
| WO | 02095805 A2 | 11/2002 |
| WO | 2004-070466 A2 | 8/2004 |

\* cited by examiner

*Primary Examiner* — Sang Paik
(74) *Attorney, Agent, or Firm* — Sughrue Mion, PLLC (57) ABSTRACT

A method for generating via-hole interconnections by laser ablation, wherein the layers to be removed and ablated from the substrate are essentially transparent to the laser radiation, but the laser light is absorbed in an underlying absorbing layer with a sufficiently high optical density at the laser wavelength.

19 Claims, 8 Drawing Sheets

ND HOLES USING LASER ENERGY

FIELD OF THE INVENTION

The invention relates to a method of forming holes using laser energy. In one embodiment, it relates to forming vertical interconnection areas (vias) between conducting layers that are separated by an insulating or semiconducting layer in a multi-layered electronic device, using a technique of laser ablation.

BACKGROUND OF THE INVENTION

Vertical interconnects are a necessary component in a microelectronic logic circuit, and in any device where an electrical connection is required between conducting layers within a multilayered substrate. An electrical connection may be required between the top pixel of the device and the drain electrode on the lower level of the device.

It is known to form a hole through a structure including a plurality of layers by the action of successively ablating the layers using a laser operating at a wavelength at which the layers have a high optical density. Laser ablation techniques are described in JP2297932, U.S. Pat. No. 4,894,115, EP0436320, and WO9820531.

For example, where the structure includes one or more layers of a material having a high energy gap, it is known to ablate a hole through such a structure using a laser at the short wavelengths (UV wavelengths) which such material readily absorb.

An objective of the present invention is to provide a new technique for forming holes using laser energy.

SUMMARY OF THE INVENTION

According to the present invention, there is provided a method of producing an electronic device, including: providing a stack including an absorbing element and a first layer provided over said absorbing element; using laser energy to create a hole through at least said first layer and expose one or more conductive elements; and providing conductive material within said hole; wherein more of the laser energy is absorbed by said absorbing element than is absorbed by said first layer, and said hole in said first layer is created predominantly by the action of energy generated within said absorbing element.

In one embodiment, the one or more conductive elements include the absorbing element.

In one embodiment, the laser fluence used is greater than the ratio of the ablation threshold of the absorbing element to the transmittance of the first layer.

In one embodiment, the laser fluence is less than the ablation threshold of the first layer.

In one embodiment, said absorbing element is provided in a layer having a thermal conductivity lower than that of said absorbing element.

In one embodiment, said absorbing element is provided on a further element having a thermal conductivity lower than that of the absorbing element.

In one embodiment, the ablation threshold of the first layer is greater than the ratio of the ablation threshold of the absorbing element to the transmission of the first layer.

In one embodiment, said laser energy is provided in one or more pulses of duration of less than 1 microsecond, preferably less than 100 nanoseconds.

In one embodiment, said laser energy is provided at a wavelength of greater than 300 nm.

In one embodiment, said stack includes a second layer below said absorbing element and a further absorbing element below said second layer, wherein said hole is created through at least said first layer, said absorbing element and said second layer, and wherein more of the laser energy is absorbed by said further absorbing element than is absorbed by said second layer, and said hole in said first and second layers is created predominantly by the action of heat generated within said absorbing element and said further absorbing element. The one or more conductive elements could include the further absorbing element.

In one embodiment, the stack includes at least one semiconducting layer and at least one insulating layer provided over the absorbing element; wherein said hole is created through said at least one semiconducting layer and said at least one insulating layer; and wherein the amount of laser energy absorbed by said absorbing element is greater than the sum of the amounts of energy absorbed by said at least one semiconducting layer and said at least one insulating layer, and said hole through said at least one semiconducting layer and said at least one insulating layer is created predominantly by the action of heat generated within said absorbing element.

One embodiment includes exposing via the hole a conductive element surface facing in the direction of the axis of the hole, and providing said conductive material within said hole such that said conductive material makes contact with said conductive element surface.

In one embodiment, said absorbing element is a conductive element and wherein said hole is created so as not to extend through the entire thickness of the absorbing element.

In one embodiment, said absorbing element has a thickness of greater than 50 nm before creating said hole.

In one embodiment, said absorbing element has a thickness of greater than 100 nm before creating said hole.

In one embodiment, the absorbing element is a conducting polymer.

In one embodiment, at least one of said one or more conductive elements is a metallic element.

In one embodiment, said one or more conductive elements includes said absorbing element.

In one embodiment, said first layer is a dielectric layer.

According to another aspect of the present invention, there is provided a method including: providing a stack including an absorbing element and a first layer provided over said absorbing element; using laser energy to create a hole through at least said first layer, wherein more of the laser energy is absorbed by said absorbing element than is absorbed by said first layer and said hole in said first layer is created predominantly by the action of heat generated within said absorbing element.

According to one embodiment of the present invention, via holes are formed based on digital pattern definition as opposed to mask-based pattern definition.

According to one embodiment of the present invention, a continuous wave laser beam is used, which has the advantage of a reduction in excess debris. According to another embodiment of the present invention, a single pulse laser is used, which avoids degradation of the upper layers of the device.

According to one embodiment of the present invention, a process for forming holes through the active layers of a device uses a laser beam that is non-absorbing in the active layers of the device, such as an IR beam, in place of an ultra-violet laser beam to generate heat within an absorbing medium. The active layers of the device are transparent to the laser beam, except for the region containing the absorbing material, such as printed conductive material.

One embodiment of the present invention, involves a method for generating via-hole interconnections by laser ablation, wherein the layers to be removed and ablated from the substrate are essentially transparent to the laser radiation, but the laser light is absorbed in an underlying absorbing layer with a sufficiently high optical density at the laser wavelength. In this way a 'volcanic', delamination or melting effect results, removing material from the transparent layers above the absorbing layer. The created via may then be filled with a conductive material to form an interconnect connection between an electrode in an upper level and the high-conductivity metal electrode on the lower level.

The absorbing layer may be a buried metallic layer, such as, but not limited to, an inorganic metal film of gold, copper or aluminium to which electrical contact is to be made through the filled via-hole interconnection. The high thermal conductivity of such metallic layers, which could lead to fast diffusion of the absorbed heat and insufficient local energy deposition to remove/ablate the upper layers of the structure, can be compensated for by using a pulsed laser beam whereby the energy can be deposited in the metallic layer on a time scale which is fast compared to the time scale of heat conduction. Preferably, the pulse duration of the laser is less than 1 µs, more preferably less than 100 ns. The laser wavelength is selected such that the optical density at the laser wavelength of the upper dielectric layers to be ablated is sufficiently small, that a sufficiently large fraction of the laser energy is absorbed in the buried metallic layer. For typical polymer dielectrics this means that the laser wavelength will typically be selected above 300 nm.

Preferably, the pulsed laser beam is a single-shot beam in order to allow for fast, high throughput via-hole fabrication. However, multiple shots might be used if the upper layers cannot be ablated in a single shot.

With a typical excimer laser ablation process, it is possible to ablate only several 100 nm per laser pulse, i.e. several laser pulses are required to ablate a via-hole interconnection through a µm thick dielectric isolation layer. With a process according to the present invention, a via-hole can be opened through a thick dielectric layer in a single shot. Such process, is therefore particularly suited to the high throughput, low resolution formation of electrical via hole interconnects. The use of a galvanometer may result in the laser being run at repeat frequencies of 100 KHz.

The buried absorbing layer may alternatively be a conducting polymer, such as but not limited to a film or patterned structure of polyethylene-dioxythiophene doped with polystyrene sulphonate (PEDOT/PSS). The conducting polymer provides strong absorption of the laser light in the visible and infrared spectra range where upper dielectric layers have low optical density, such that a large fraction of the laser energy is absorbed in the buried conducting polymer. The conducting polymer also has a comparatively small thermal conductivity compared to common inorganic metals, which allows the use of a continuous wave laser. The conducting polymer may be in contact with another electrically conducting layer. Preferably, this layer has a relatively low thermal conductivity, for example, a ceramic conductor, such as indium tin oxide. The laser beam of a wavelength absorbed by the highly absorbing conducting polymer within the exposed region has the effect of dissipating the heat up through the layers of the device from the laser beam as it penetrates the conductive material of the device, resulting in a melting effect.

Several techniques can be used to reduce the thermal conductivity of a metallic layer. This might be achieved by selecting the thickness of the metallic material to be sufficiently small such that thermal conduction through the film does not dissipate the energy significantly. Alternatively, the metallic material might be patterned laterally into a narrow strip in order to limit heat conduction away from the irradiated region. Such techniques might allow the use of inorganic metals with higher intrinsic thermal conductivity which would not be ablatable with a given laser setup if such techniques for reducing their thermal conductance were not used.

According to one embodiment of the present invention, there is provided a method of forming vertical electrical interconnects using a laser beam of varying wavelengths to generate heat within an absorbing medium, resulting in the removal of material of the overlying layers.

The method of the present invention is particularly suitable for the production of via holes in multi-level devices, such as those incorporating a highly absorbing dielectric medium on the first level of the device.

DESCRIPTION OF THE DRAWINGS

Embodiments of the invention are hereunder described in detail, by way of example only, and with reference to the accompanying drawings, in which.

DESCRIPTION OF PREFERRED EMBODIMENTS

First Embodiment: A method for the formation of electrical via hole interconnects, by the removal of material above an underlying high conductivity material, using a technique of laser ablation with a single pulse laser beam.

Figure 1:
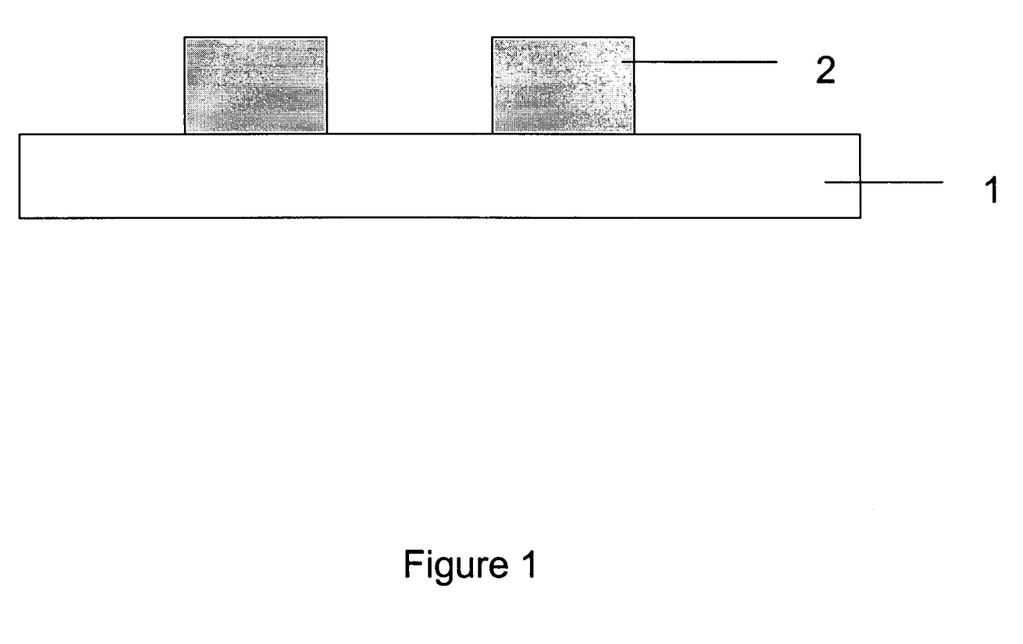
FIG. 1 shows conductive material that is deposited and patterned on a substrate to form source and drain electrodes of an electronic device.

FIG. 1 shows conductive material that is deposited and patterned on a substrate 1 to form source and drain electrodes 2, or other electrodes, such as gate electrodes or interconnect lines of the electronic device. The substrate may be either glass or a polymer film, but preferably a plastic substrate such as polyethyleneterephtalate (PET) or polyethylenenaphtalene (PEN) is used. The highly conductive region 2 consists preferably of a metallic material, such as gold (Au), copper, aluminum, or annealed silver nanoparticles (Ag). The conductive layer is deposited using solution processing techniques such as spin, dip, blade, bar, slot-die, or spray coating, inkjet, gravure, offset or screen printing, or by vacuum deposition, such as evaporation or preferably a sputtering technique. The conductive layer is patterned to form source and drain electrodes 2 by a process such as, but not limited to, optical lithography or laser ablation. The conductive layer may also be patterned by a direct-write printing technique such as inkjet printing. The metallic material is chosen to absorb some of the radiation of the laser beam, i.e. it is chosen to have a reflectivity at the laser wavelength of less than 1. This can be achieved, for example, by choosing metals with a plasma frequency near the visible spectral range, such as gold or silver, and choosing a laser wavelength as near as possible to the plasma frequency, but still at a sufficiently long wavelength that the laser radiation is not strongly absorbed by any of the upper layers, such as any of the dielectric layers. On top of the metal layer the remaining TFT layers are deposited as discussed below, and are selected to have a low absorption or to be transparent at the selected laser wavelength.

Figure 2:
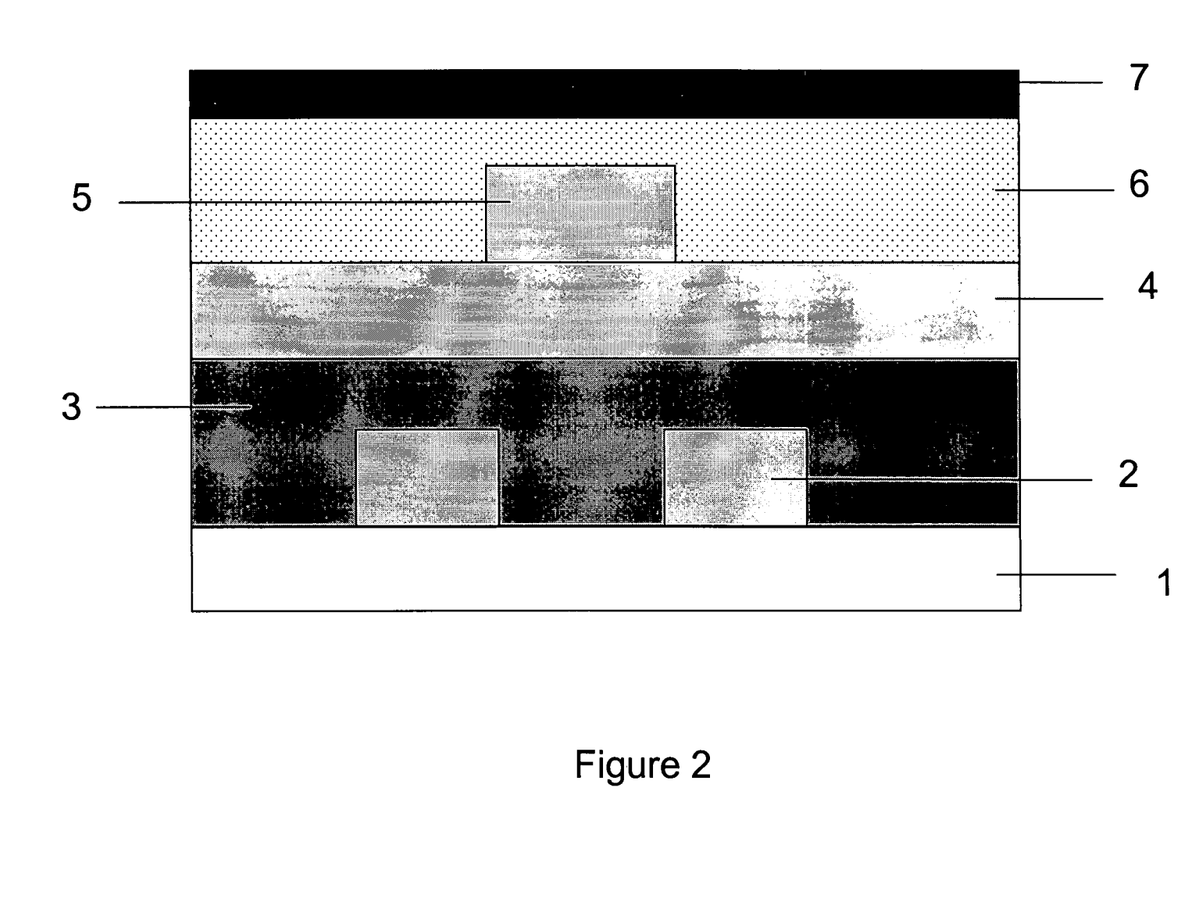
FIG. 2 illustrates a layered substrate comprising a top-gate transistor, and an upper conducting electrode separated from the layers of the transistor by a dielectric layer.

Once the conductive layer has been patterned to form the source and drain electrodes, a layer of semiconducting material 3 is then deposited over the substrate and patterned electrodes, as is shown in FIG. 2. The semiconducting layer may consist of materials such as, but not limited to, polyarylamine, polyfluorene or polythiophene derivatives. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating.

A layer of gate dielectric material 4 is then deposited onto the layered substrate. Materials such as polyisobutylene or polyvinylphenol may be used as the dielectric material, but preferably polymethylmethacrylate (PMMA) and polystyrene are used. The dielectric material may be deposited in the form of a continuous layer, by techniques such as, but not limited to, spray or blade coating. However, preferably, the technique of spray coating is used. The deposition of a gate dielectric 4 on top of a semiconducting layer 3 requires careful adjustment of the solvent of the gate dielectric layer in order to avoid dissolution or swelling of the semiconducting layer (see U.S. Ser. No. 10/176,007).

The deposition of the dielectric layer is then followed by the deposition and patterning of a gate electrode 5 and interconnect lines. The material of the gate electrode may be a patterned thin film of inorganic metals such as gold, copper or a pattern of printable inorganic nanoparticles of silver or gold, or a conducting polymer, such as polyethylenedioxythiophene doped with polystyrene sulfonic acid (PEDOT/PSS). The gate electrode is deposited using techniques such as sputtering or evaporation techniques or solution processing techniques such as spin, dip, blade, bar, slot-die, gravure, offset or screen printing. Preferably, the gate electrode is deposited using the solution processing technique of ink jet printing.

At least one additional layer of dielectric material 6 is deposited on the substrate after the deposition of the gate electrode and interconnect and data lines. The dielectric material may be deposited from solution in the form of a continuous layer, by techniques such as, but not limited to, spin coating ink-jet printing, spray-coating, roller coating spray or blade coating. However, preferably, the technique of spray coating is used. The dielectric material may also be deposited using vapour phase deposition techniques like evaporation or chemical vapour deposition. The dielectric material should be deposited in such a way so that no degradation occurs to the underlying layers. A method to achieve this is disclosed in patent number WO01/47043. In this patent, a method for forming a transistor is disclosed by depositing a first material from solution in a first solvent to form a first layer of the transistor; and subsequently whilst the first material remains soluble in the first solvent, forming a second layer of the transistor by depositing over the first material a second material from solution in a second solvent in which the first material is substantially insoluble. A suitable solution processable dielectric material that may be used as a second dielectric layer 6 is polystyrene dissolved in xylene. In addition, parylene is an example of a dielectric material that may be deposited via chemical vapour phase deposition.

A top pixel electrode 7 is then deposited. The top conductive layer is preferably a conducting polymer such as PEDOT/PSS.

The via hole interconnect 8 (see FIG. 3) or top pixel interconnects are then formed through the layers of the device. A via hole may be created from the top pixel electrode through to the drain electrode on the lower level of the device. A beam from a laser, such as a pulsed beam from a YAG laser, operating at a wavelength in the region of 1064 nm is preferably used to penetrate the layers of the device. The laser beam penetrates through the dielectric and semiconductor layers of the device without being absorbed by the material. Therefore, as the laser beam is transmitted through the layers of the substrate stack, the material of the layers remains in tact. The laser beam then reaches the highly absorbing metallic material, such as but not limited to a patterned film of gold, at the bottom of the device. The absorption of the beam by the gold layer 2, results in the creation of heat within the gold layer which leads to a 'volcanic effect' on the overlying layers of the device, causing these upper layers to delaminate. A via hole is therefore created directly above the highly absorbing metallic layer. It is sometimes the case that the gold absorbing material, such as the drain contact, is also ablated during the process. In this case, an electrical connection may still be made between the upper and lower conductive layers, by the remaining annular ring at the base of the via hole.

Figure 3:
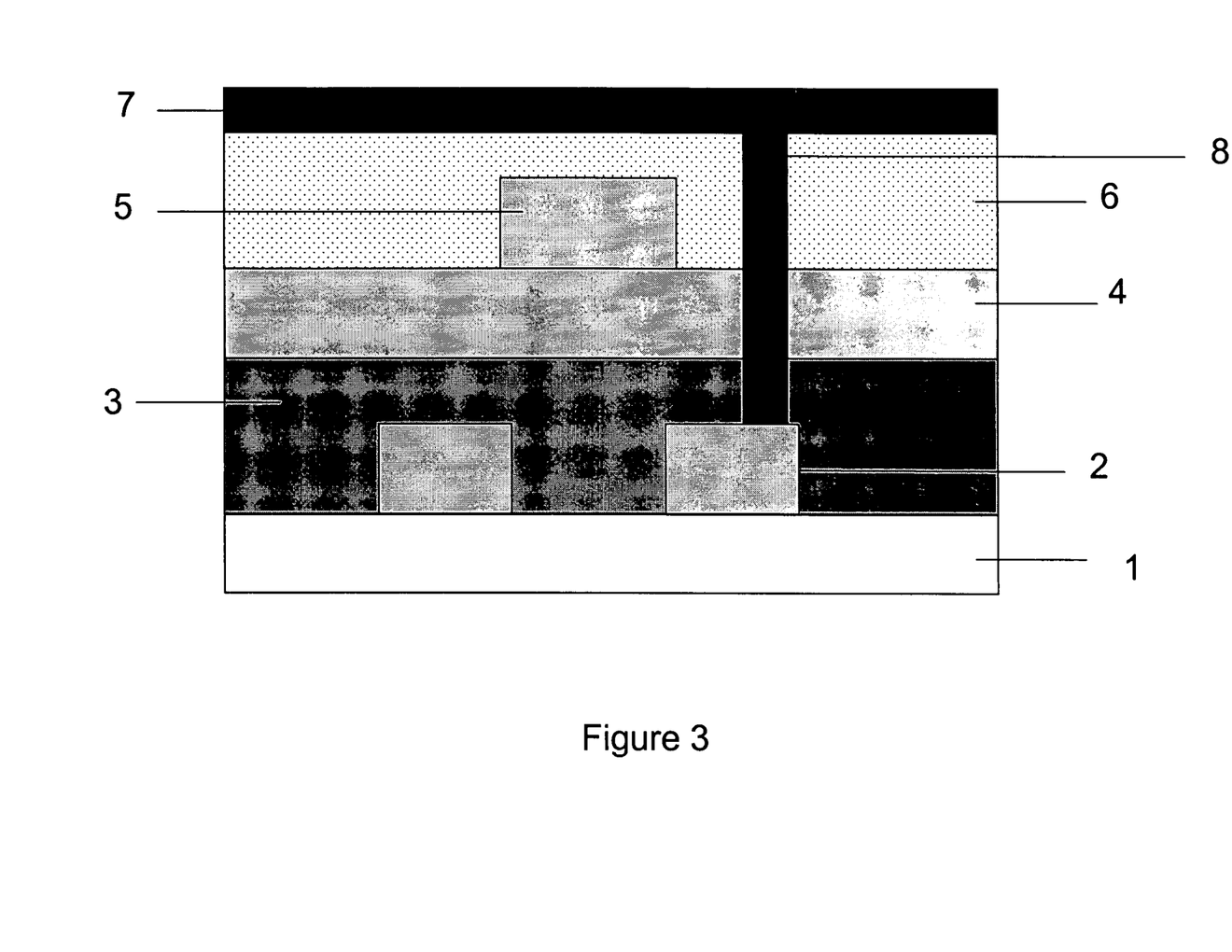
FIG. 3 shows the formation according to an embodiment of the present invention of a via interconnect between the upper conducting electrode and one of the electrodes of the transistor through the dielectric layer.

Subsequently, the via-hole is filled by depositing a conducting material into the so-generated via-hole 8. This can, for example, be achieved by printing a conducting ink, such as conducting polymer ink into the via-hole, or by vacuum depositing a metallic film into the via-hole.

According to an alternative process sequence the top conducting electrode 7 may also be deposited after the opening of the via-hole interconnection. In this case the steps of depositing the top conducting electrode 7, and the filling of the via-hole interconnection may be combined into one process step.

The laser fluence used is preferably greater than the ratio of the ablation threshold of gold layer 2 to the combined transmittance of layers 3, 4, 6, where (i) laser fluence ($F_{laser}$) is defined as the radiation flux density multiplied by the exposure time; it refers to the total amount of energy applied per unit area; the units are $J/cm^2$; (ii) the radiation flux density is defined as the rate of flow of radiated energy through unit area of surface normal to the beam; (iii) the ablation threshold ($F_T$) of a material is defined as the minimum laser fluence required to break the bonds between the molecules of a material; (iii)

the transmittance of a layer or combination of layers is defined as $10^{-\alpha}$, where α is defined as the optical density or absorbance of the layer or combination of layers.

$$F_T(\text{layer 2})/10^{-\alpha(\text{layers 3, 4 and 6})} < F_{laser}$$

The laser fluence is preferably less than the ablation threshold of each of layers 3, 4 and 6.

$$F_T(\text{layer 3}) > F_{laser}$$

$$F_T(\text{layer 4}) > F_{laser}$$

$$F_T(\text{layer 6}) > F_{laser}$$

The ablation threshold of each of layers 3, 4 and 6 is preferably greater than the ratio of the ablation threshold of gold layer 2 to the combined transmission of the layers 3, 4 and 6.

$$F_T(\text{layer 2})/10^{-\alpha(\text{layers 3, 4 and 6})} < F_{laser} < F_T(\text{layer 3})$$

$$F_T(\text{layer 2})/10^{-\alpha(\text{layers 3, 4 and 6})} < F_{laser} < F_T(\text{layer 4})$$

$$F_T(\text{layer 2})/10^{-\alpha(\text{layers 3, 4 and 6})} < F_{laser} < F_T(\text{layer 6})$$

Second Embodiment: A method for the formation of electrical via hole interconnects, by the removal of material above an underlying highly absorbing conducting material, using a technique of laser ablation with continuous wave laser beam.

Figure 4:
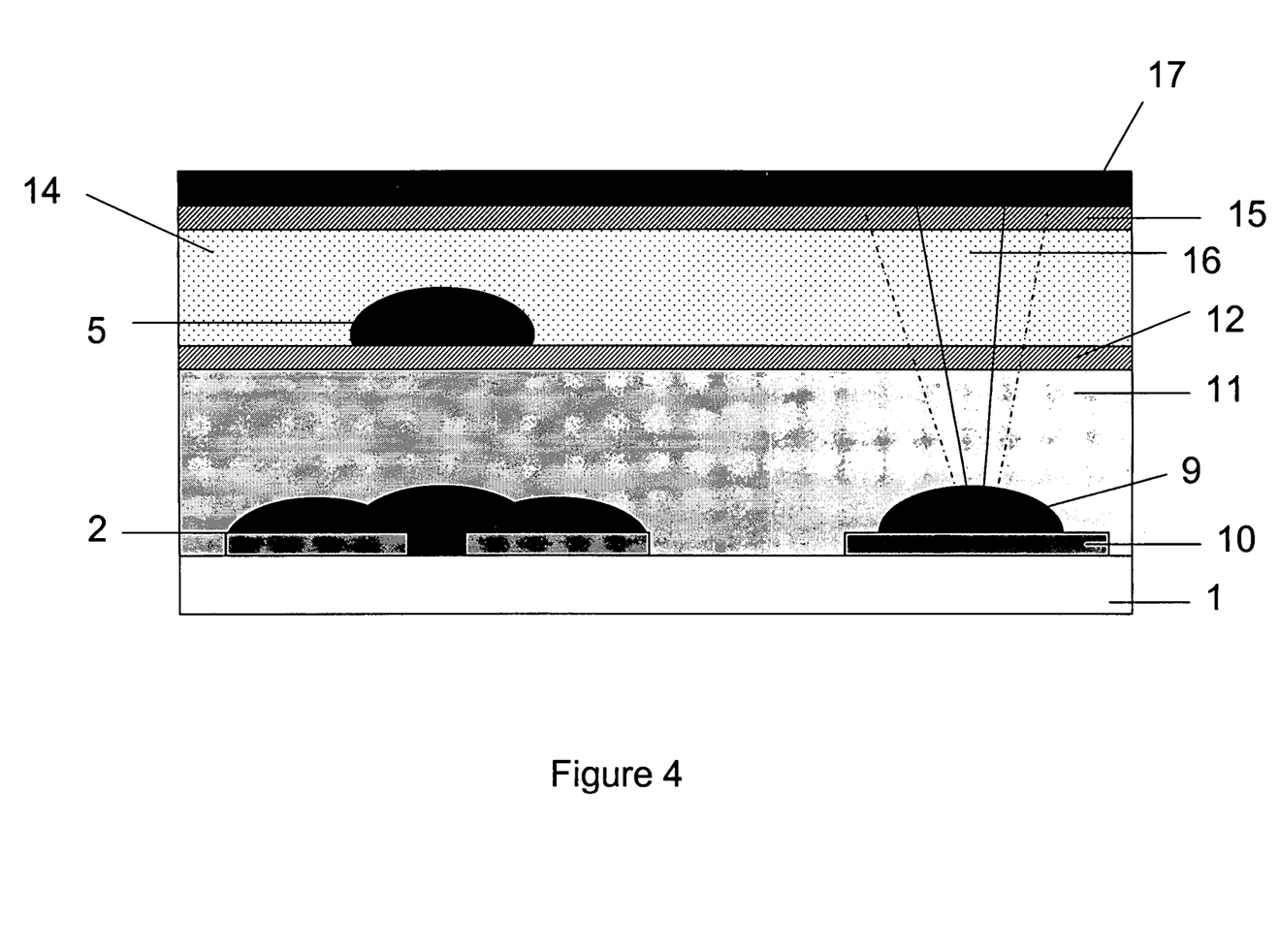
FIG. 4 shows a schematic diagram of a via hole fabrication process according to another embodiment of the present invention.

The fabrication of a multi-level stack for polymer-based printed TFTs is illustrated in FIG. 4. Metallic lower layer indium tin oxide (ITO) or other material of relatively thermal conductance 10 is deposited and patterned on a substrate 1 to form electrodes or interconnects 2 of the electronic device. The substrate may be either glass or a polymer film, but preferably a plastic substrate such as polyethyleneterephtalate (PET) or polyethylenenaphtalene (PEN) is used. A patterned conductive polymer layer 9 is positioned on top of the ITO surface.

The ITO material is patterned by a technique such as optical lithography or by a printing process. A highly absorbing conducting polymer 9 is then deposited over the patterned metal layer. Conducting polymers have strong optical absorption across the visible and infrared spectra range which are caused by polaron and bipolaron absorption features, and residual absorption features of neutral polymer chain segments (L. Groenendaal, et al., Advanced Materials Volume 12, 2000, Pages: 481-494). A suitable material for this highly absorbing medium is preferably poly(3,4-ethylenedioxy-thio-phene) (PEDOT/PSS), but silver nanoparticles may also be used. This material may be deposited by a range of different printing techniques, such as but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, spin-coating, blade coating or dip coating, curtain coating, meniscus coating, spray coating, or extrusion coating. A preferred technique is drop-on- demand inkjet printing.

Although an absorbing dye is not required to be added to the highly absorbing medium, such a dye may be added if necessary to further aid absorption within the desired wavelength region. In the present example, the overlying TFT layers (which are discussed below) are deposited over the above mentioned conducting and absorbing material, and are all non-absorbing at the chosen wavelength.

As stated above, the semiconducting layer 11 may consist of materials such as, but not limited to, polyarylamine, polyfluorene or polythiophene derivatives. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating.

A layer of gate dielectric material 12 is then deposited onto the layered substrate. Materials such as polyisobutylene or polyvinylphenol may be used as the dielectric material, but preferably polymethylmethacrylate (PMMA) and polystyrene are used. The dielectric material may be deposited in the form of a continuous layer, by techniques such as, but not limited to, spray or blade coating. However, preferably, the technique of spray coating is used.

The deposition of a gate dielectric 12 on top of a semiconducting layer 11 requires careful adjustment of the solvent of the gate dielectric layer in order to avoid dissolution or swelling of the semiconducting layer (see WO 01/47043). In this invention, a preferred material for the dielectric layer is PMMA (polyvinylphenol/polymethylmethacrylate), although polyisobutylene may also be used.

The deposition of the dielectric layer is then followed by the deposition and patterning of a gate electrode 13 and interconnect lines. The material of the gate electrode may be a patterned thin film of inorganic metals such as gold, copper or a pattern of printable inorganic nanoparticles of silver or gold, or a conducting polymer, such as polyethylenedioxythiophene doped with polystyrene sulfonic acid (PEDOT/PSS). The gate electrode is deposited using techniques such as sputtering or evaporation techniques or solution processing techniques such as spin, dip, blade, bar, slot-die, gravure, offset or screen printing. Preferably, the gate electrode is deposited using the solution processing technique of ink jet printing.

A second pixel dielectric material 14, which is preferably polystyrene is then deposited from solution over the gate electrode. The solvent is chosen such that it does not dissolve the first dielectric. The second dielectric might also comprise other layers, such as, for example, a wetting layer 15 to facilitate the wetting and adhesion of a subsequently deposited top electrode 17.

As shown in FIG. 4, a continuous wave laser beam that is operating at a desired wavelength of about 830 nm is focused over the region directly above the highly absorbing conducting polymer deposited on the lower metallic layer of the device. The light from the laser beam is absorbed by the highly-absorbing conducting polymer and is converted into heat. The heat generated is sufficient to either melt or ablate all of the material found in the area of increased energy directly above the light absorbing material. It is desirable that the ablation threshold of the upper layers is lower than that of the metal electrode 10 on which the highly absorbing conducting polymer 9 is deposited. In this way the bottom of the via-hole comprises a continuous conductive layer. However, even if some or all of the metal film 10 is being ablated simultaneously with the upper layers of the device, it is still possible to connect to the lower electrode 10 through an annular ring by subsequently filling the via-hole 16 with conductive material.

Subsequently, the via-hole 16 is filled by depositing a conducting material into the so-generated via-hole. This can, for example, be achieved by printing a conducting ink, such as conducting polymer or printable metal ink into the via-hole, or by vacuum depositing a metallic film into the via-hole.

When filling the via-hole an electrical connection is established between the lower electrode 10, and an upper electrode 17. There are several process options for defining the upper electrode 17. Preferably the upper electrode 17 is defined in the same process step as the step of filling the via-hole interconnection.

The laser fluence used is preferably greater than the ratio of the ablation threshold of element 9 to the combined transmittance of layers 11, 12, 15 and 16.

$$F_T(\text{element } 9)/10^{-\alpha(\text{layers } 11, 12, 15 \text{ and } 16)} < F_{laser}$$

The laser fluence is preferably less than the ablation threshold of each of layers 11, 12, 15 and 16.

$$F_T(\text{layer } 11) > F_{laser}$$

$$F_T(\text{layer } 12) > F_{laser}$$

$$F_T(\text{layer } 15) > F_{laser}$$

$$F_T(\text{layer } 16) > F_{laser}$$

The ablation threshold of each of layers 11, 12, 15 and 16 is preferably greater than the ratio of the ablation threshold of element 9 to the combined transmission of layers 11, 12, 15 and 16.

$$F_T(\text{element } 9)/10^{-\alpha(\text{layers } 11, 12, 15 \text{ and } 16)} < F_{laser} < F_T \text{ (layer 11)}$$

$$F_T(\text{element } 9)/10^{-\alpha(\text{layers } 11, 12, 15 \text{ and } 16)} < F_{laser} < F_T \text{ (layer 12)}$$

$$F_T(\text{element } 9)/10^{-\alpha(\text{layers } 11, 12, 15 \text{ and } 16)} < F_{laser} < F_T \text{ (layer 15)}$$

$$F_T(\text{element } 9)/10^{-\alpha(\text{layers } 11, 12, 15 \text{ and } 16)} < F_{laser} < F_T \text{ (layer 16)}$$

The materials and thicknesses for the layers 11, 12, 15 and 16 are preferably selected so as to fulfill the above preferred conditions. For example, PMMA is less absorbing than PVP, and could be used in greater thicknesses whilst still fulfilling the above preferred conditions.

Alternatively, the upper electrode can also be defined in a subsequent process step after filling the vias or prior to the via-opening. In the latter case care needs to be taken such that the absorption of the upper conductive electrode at the laser wavelength is sufficiently low such that the laser radiation can effectively be absorbed in the highly absorbing conductive layer 9.

The above mentioned pixel electrode is composed of a conductive material, such as PEDOT or alternatively, of a vacuum deposited or printed metal layers, such as silver, copper or gold. The conductive material may be deposited by techniques such as, but not limited to sputtering techniques or solution-processing or printing techniques.

Figure 5:
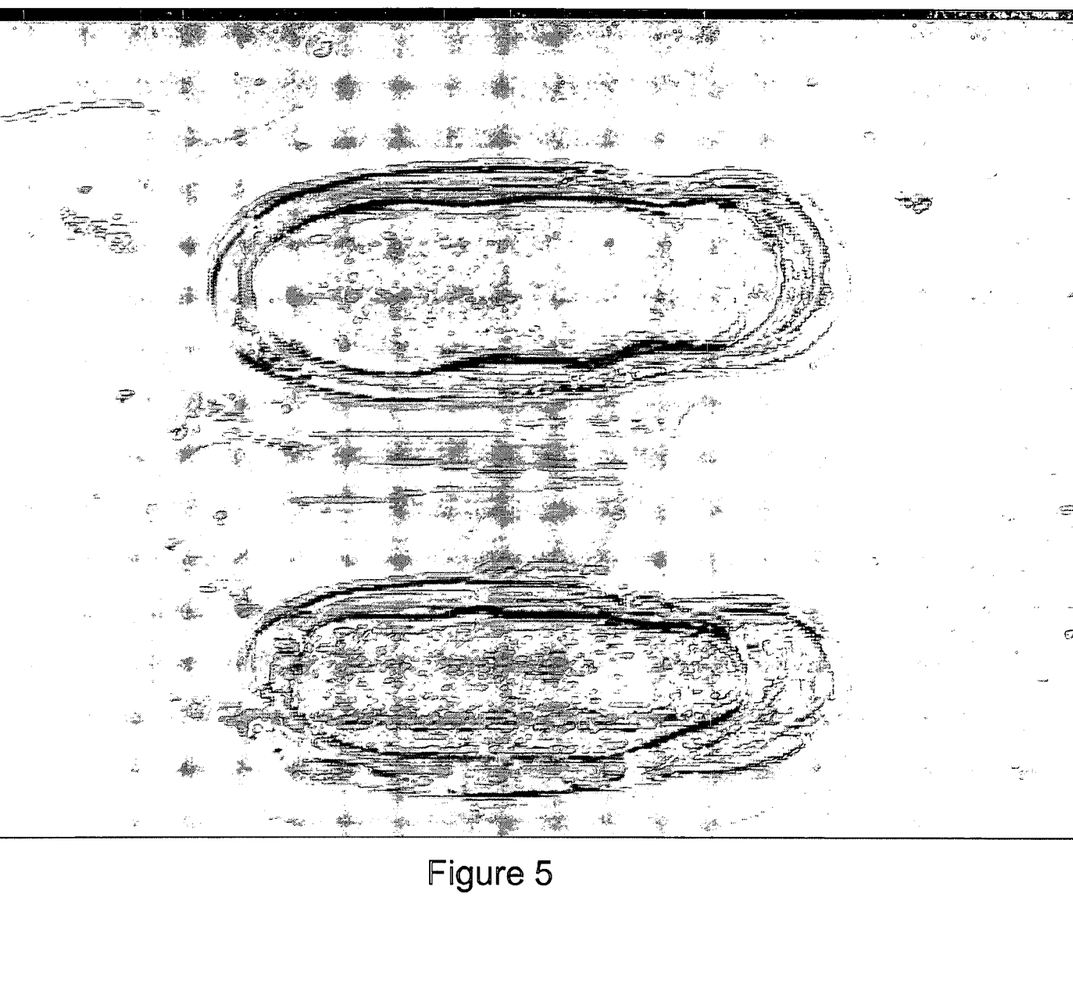
FIG. 5 shows an optical micrograph of a substrate that has been subject to a method of laser ablation for forming vertical electrical interconnects according to an embodiment of the present invention.

FIG. 5 shows an optical micrograph of a substrate that has been subject to a method of forming vertical electrical interconnects. The various layers of the device have been exposed to a laser beam in order to generate heat within an absorbing medium resulting in the ablation of the upper layers.

Figure 6:
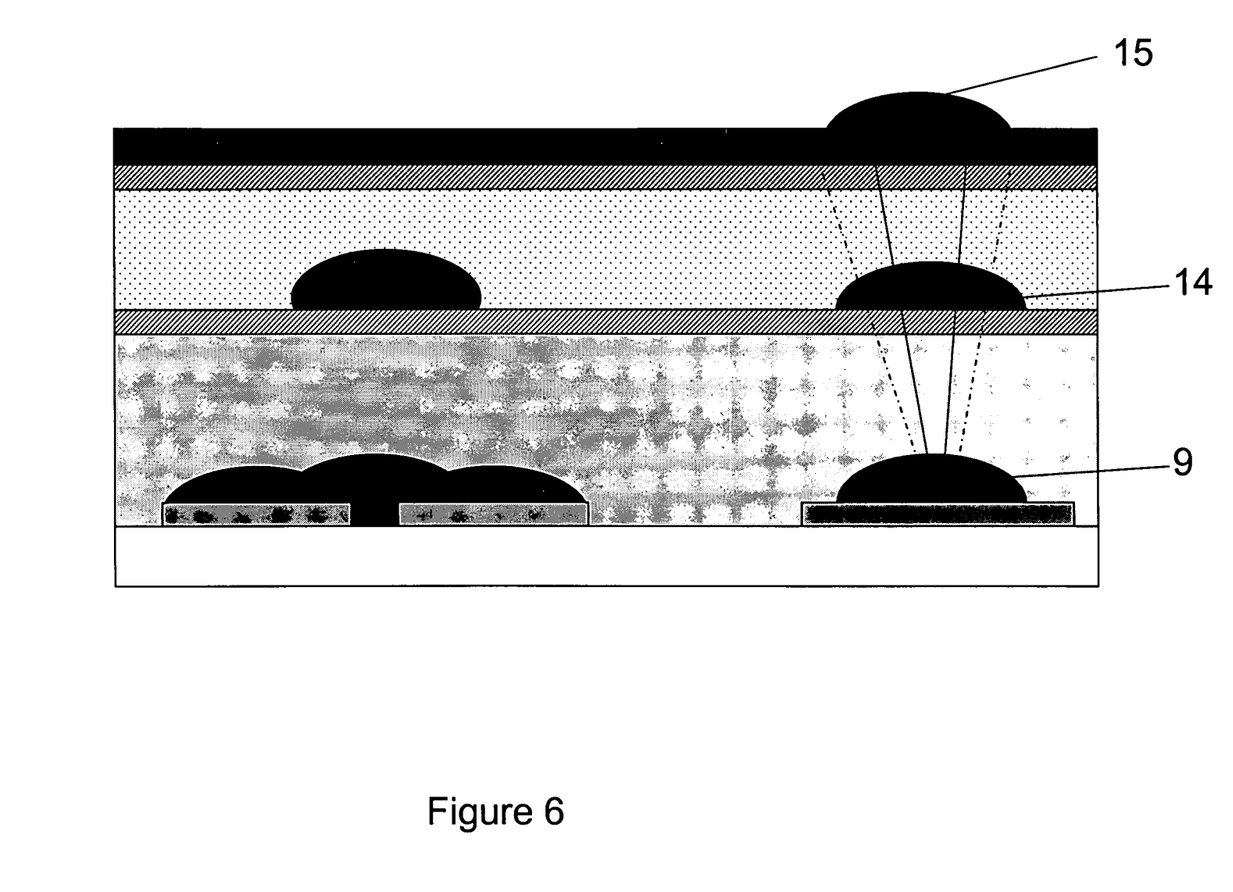
FIG. 6 illustrates the formation of a via hole as a result of a laser ablation process according to an embodiment of the present invention to connect electrodes in multiple layers of a device.

In yet another embodiment of the present invention a pattern of a highly absorbing conductive material, such as the above mentioned conducting polymer PEDOT/PSS ink may be deposited on a lower conductive structure on the first level and on one or several intermediate 14 and upper levels 15 of the device as shown in FIG. 6. As in the first embodiment of this invention, the conducting material may contain a dye capable of absorbing at the desired wavelength and the remaining materials within the TFT layers are all non-absorbing at this wavelength. The presence of the highly absorbing material on each level of the aforementioned device serves to improve the efficiency of ablation in case where via holes are to be opened to a multilayer structure in a single process step, as well as to aid the positioning of the via hole. The deposition of this material directly above the initial deposit of absorbing material allows for more accurate ablation of the material in the various layers of the structure.

In this case absorbing conducting polymer material 9, 14, 15 is chosen such that it allows a proportion of the light from the laser beam to be absorbed and the remainder of the beam to penetrate deeper into the structure to be absorbed by absorbing conductive material in underlying layers. The transmitted beam is able to proceed through the material to the bottom level of the device. As with the upper level, a proportion of the beam is again absorbed by and ablates the said material and the remainder is transmitted through the material to the next level. The laser beam is able to be guided by the absorbing material through each level of the device.

Figure 7:
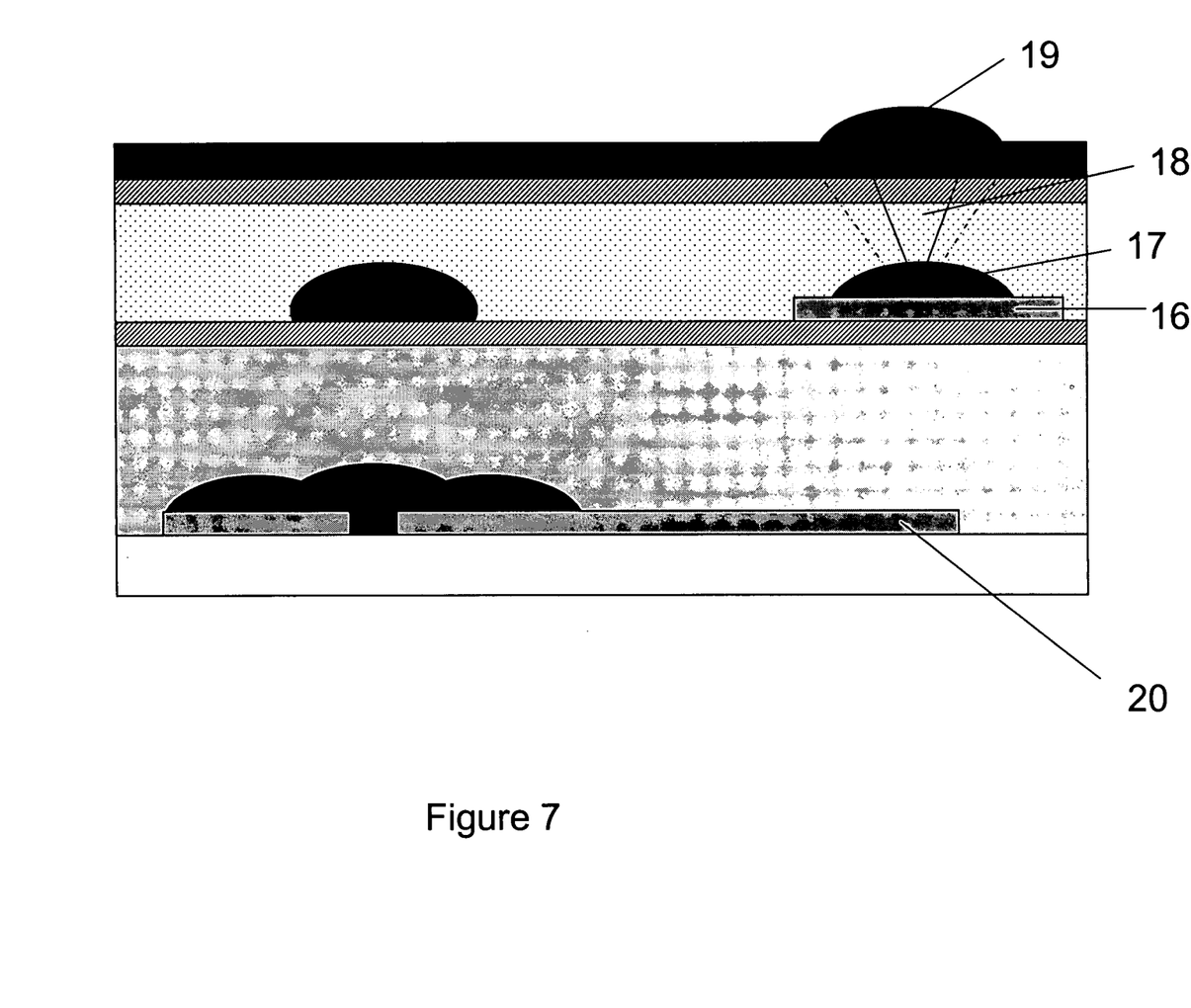
FIG. 7 illustrates an alternative structure for the formation of a via hole as a result of a laser ablation process according to an embodiment of the present invention to connect electrodes in multiple layers of a device.

According to another embodiment as shown in FIG. 7, a highly absorbing conducting polymer pattern 17 is used at an intermediate level of the structure in conjunction with a non-ablatable metal pattern 16, which protects an underlying conductive pattern 20 during the laser ablation of the via hole interconnection 18 between a top level metal electrode 19, and the intermediate level electrode 16 without making electrical connection to the lower level electrode 20. This embodiment of the invention is particular useful for multi-level structures where there is a desire for the formation of interconnects between the upper and an intermediate level of the device.

The laser fluence used is preferably greater than the ratio of the ablation threshold of element 17 to the transmittance of layer 18.

The laser fluence is preferably less than the ablation threshold of layer 18.

The ablation threshold of layer 18 is preferably greater than the ratio of the ablation threshold of element 17 to the transmittance of layer 18.

Figure 8:
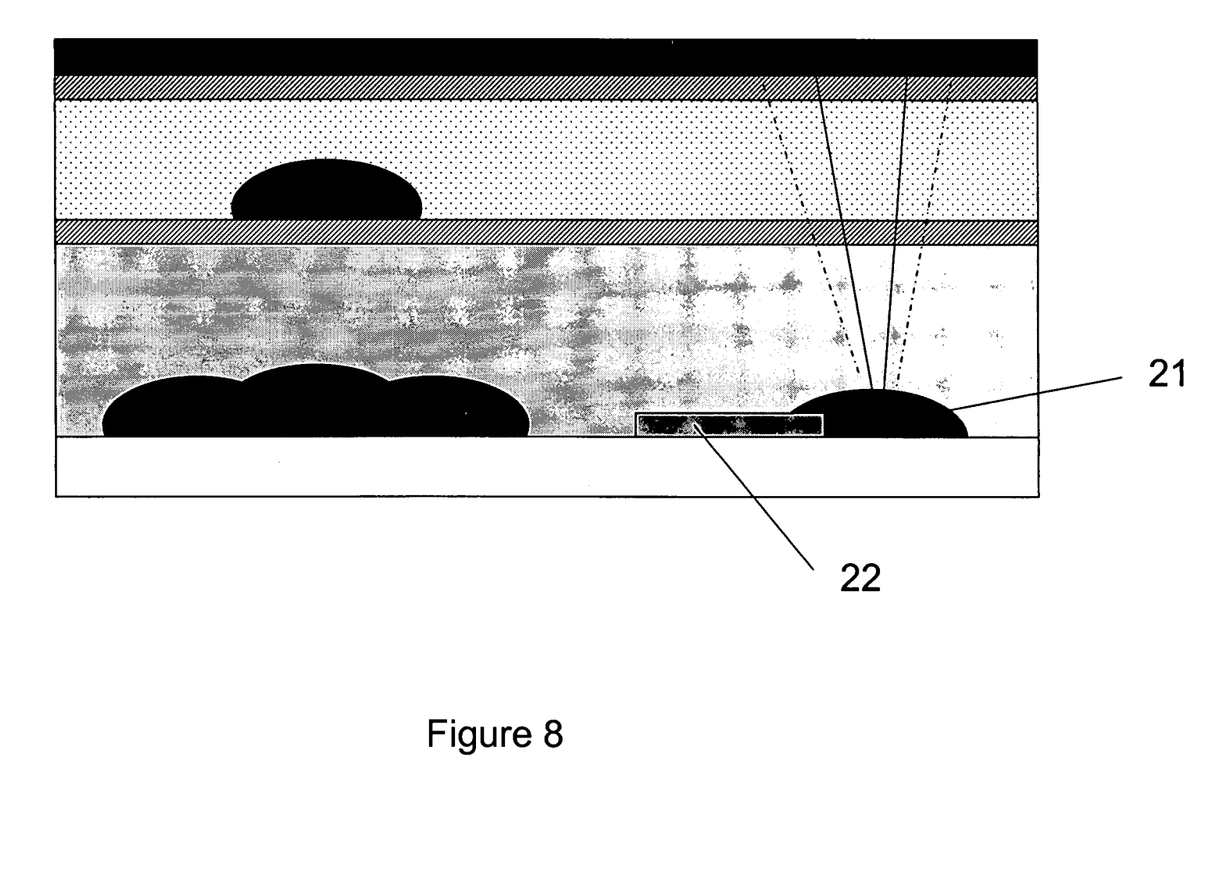
FIG. 8 illustrates a process of via hole fabrication according to an embodiment of the present invention, incorporating a sacrificial conductive material for absorption of laser radiation in a device layer to which no electrical contact needs to be made.

Another embodiment, as illustrated in FIG. 8, involves a device structure without a metal electrode in the area of the device exposed to the laser beam. In this case the conducting polymer on the lower level 21 is not on top of a metallic material in the region of the via-hole interconnection. The conducting polymer might be in contact with a metal layer 22 in a region separated from the via-hole interconnection.

This method of forming interconnects may be used to create via holes in the aforementioned large area displays to electrically connect pixels or interconnect lines in different layers. In addition, via holes may be created in logic circuits and organic optoelectronics.

The above-described techniques provide a high speed, low cost, digital method of forming vertical electrical interconnects.

The present invention is not limited to the foregoing examples.

The present invention provides a general method for generating holes in structures by laser ablation, wherein at least one layer to be removed and ablated from the substrate is essentially transparent to the laser radiation, but the laser light is absorbed in an underlying absorbing layer with a sufficiently high optical density at the laser wavelength. The invention is applicable not only to the formation of electrical via-hole interconnections, but also to the generation of other 3-dimensional structures such as those required, for example, in micro-electrical-mechanical systems (MEMS).

The laser absorbing material on lower levels might also be a semiconducting material, such as a semiconducting polymer, or a dielectric material loaded with an absorbing dye, such as an organic dye molecule or pigment, or a conductive particle.

The examples have been focused on the specific structure of bottom-gate transistors. It will be apparent to a person skilled in the art that the present invention can be equally applied to other structures, such as for example, (i) other transistor architectures, such as bottom-gate transistors, (ii) other multilayer interconnect structures that do not involve transistor devices, or (iii) structures for other devices such as, but not limited to, capacitors, resistors, inductors, diodes etc.

Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A method including:
   providing a stack including an absorbing element and a first layer provided over said absorbing element;
   using laser energy to create a hole through at least said first layer,
   wherein more of the laser energy is absorbed by said absorbing element than is absorbed by said first layer and said hole in said first layer is created predominantly by the action of heat generated within said absorbing element, and
   wherein the absorbing element is patterned such that the first layer extends laterally beyond the absorbing element, and the absorbing element is used to aid positioning of said hole.

2. A method according to claim 1, wherein said hole extends through at least said first layer and exposes one or more conductive elements; and further comprising providing conductive material within said hole.

3. A method according to claim 1, including exposing via the hole a conductive element surface facing in the direction of the axis of the hole, and providing said conductive material within said hole such that said conductive material makes contact with said conductive element surface.

4. A method according to claim 1, wherein at least one of said one or more conductive elements is a metallic element.

5. A method according to claim 1, wherein said one or more conductive elements includes said absorbing element.

6. A method according to claim 1, wherein the first layer is a dielectric layer.

7. A method as claimed in claim 1, wherein the laser fluence used is greater than the ratio of the ablation threshold of the absorbing element to the transmittance of the first layer.

8. A method as claimed in claim 1, wherein the laser fluence is less than the ablation threshold of the first layer.

9. A method according to claim 1, wherein said absorbing element is provided in a layer of material having a thermal conductivity lower than that of a material of said absorbing element.

10. A method according to claim 1, wherein said absorbing element is provided on a further element made of a material having a thermal conductivity lower than that of a material of said absorbing element.

11. A method as claimed in claim 1, wherein the ablation threshold of the first layer is greater than the ratio of the ablation threshold of the absorbing element to the transmission of the first layer.

12. A method according to claim 1, wherein said laser energy is provided in one or more pulses of duration of less than 1 microsecond, preferably less than 100 nanoseconds.

13. A method according to claim 1, wherein said laser energy is provided at a wavelength of greater than 300 nm.

14. A method according to claim 1, wherein said stack includes a second layer below said absorbing element and a further absorbing element below said second layer, wherein said hole is created through at least said first layer, said absorbing element and said second layer, and wherein more of the laser energy is absorbed by said further absorbing element than is absorbed by said second layer, and said hole in said first and second layers is created predominantly by the action of heat generated within said absorbing element and said further absorbing element.

15. A method according to claim 1, wherein the stack includes at least one semiconducting layer and at least one insulating layer provided over the absorbing element; wherein said hole is created through said at least one semiconducting layer and said at least one insulating layer; and wherein the amount of laser energy absorbed by said absorbing element is greater than the sum of the amounts of energy absorbed by said at least one semiconducting layer and said at least one insulating layer, and said hole through said at least one semiconducting layer and said at least one insulating layer is created predominantly by the action of heat generated within said absorbing element.

16. A method according to claim 1, wherein said absorbing element is a conductive element and wherein said hole is created so as not to extend through the entire thickness of the absorbing element.

17. A method according to claim 16, wherein said absorbing element has a thickness of greater than 50 nm before creating said hole.

18. A method according to claim 17, wherein said absorbing element has a thickness of greater than 100 nm before creating said hole.

19. A method according to claim 1, wherein the absorbing element is a conducting polymer.

* * * * *